US008370652B2

(12) United States Patent
Liu et al.

(10) Patent No.: US 8,370,652 B2
(45) Date of Patent: Feb. 5, 2013

(54) AUTOMATIC DISCOVERY OF SERVER TO POWER-CIRCUIT CONNECTIONS

(75) Inventors: Jie Liu, Medina, WA (US); Garret Cole, Seattle, WA (US); Jeff O'Reilly, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 464 days.

(21) Appl. No.: 12/688,207

(22) Filed: Jan. 15, 2010

(65) Prior Publication Data

US 2011/0179301 A1    Jul. 21, 2011

(51) Int. Cl.
*G06F 1/00* (2006.01)
*G06F 1/26* (2006.01)
*G06F 15/173* (2006.01)
*G06F 11/00* (2006.01)
*H02J 1/00* (2006.01)
*H02J 1/10* (2006.01)
*G01R 21/00* (2006.01)

(52) U.S. Cl. .......... 713/300; 713/320; 713/323; 307/11; 307/43; 702/60; 709/223; 714/14; 714/22

(58) Field of Classification Search ............... 713/300, 713/320, 323; 307/11, 43; 702/60; 709/223; 714/14, 22
See application file for complete search history.

(56) References Cited

U.S. PATENT DOCUMENTS

| 6,631,309 | B2 | 10/2003 | Boies et al. | |
|---|---|---|---|---|
| 7,269,753 | B2 | 9/2007 | Farkas et al. | |
| 2006/0044117 | A1* | 3/2006 | Farkas et al. | ............. 340/310.11 |
| 2008/0004837 | A1 | 1/2008 | Zwinger et al. | |
| 2009/0006873 | A1 | 1/2009 | Bellofatto et al. | |
| 2009/0085586 | A1 | 4/2009 | Anderson | |
| 2009/0282274 | A1 | 11/2009 | Langgood et al. | |
| 2009/0307515 | A1 | 12/2009 | Bandholz et al. | |
| 2010/0070217 | A1* | 3/2010 | Shimada et al. | ................ 702/62 |
| 2012/0095610 | A1* | 4/2012 | Chapel et al. | ................. 700/297 |

FOREIGN PATENT DOCUMENTS

| EP | 2109028 A2 | 10/2009 |
|---|---|---|
| WO | 2009120880 A2 | 10/2009 |

OTHER PUBLICATIONS

Avocent Corporation, Track, monitor and measure data center power consumption and cost with Avocent DSView 3 power manager, Apr. 28, 2008, retrieved from http://www.avocent.com/NewsRoom/NewsRoom.aspx?id=10059.

(Continued)

*Primary Examiner* — Stefan Stoynov
(74) *Attorney, Agent, or Firm* — Lyon & Harr, LLP; Richard T. Lyon

(57) ABSTRACT

In a data center which includes a plurality of servers, a discovery computer, a power measurement system (PMS), and a plurality of power-circuits which supply power to the servers, the discovery computer performs the following actions for each server. It transmits a first command to the server causing the server to start generating a power consumption signature if the server is able to do so. Upon receiving a SUCCESS response from the server, it instructs the PMS to start measuring the power consumption from each power-circuit. After a prescribed interval of time has elapsed, it collects the measurements from the PMS and analyzes the measurements to look for the presence of the signature. Upon detecting the signature in the measurement taken from a particular power-circuit, the discovery computer concludes that the server is connected to the particular power-circuit and creates a mapping there-between.

18 Claims, 6 Drawing Sheets

OTHER PUBLICATIONS

Cuthbertson, D., J. Hardy, Integrating environment monitoring & data center management, retrieved Oct. 23, 2009 from http://www.assetgen.com/knowledgebase/Linking Data Center Management to Power Monitoring Systems. pdf.

Dranetz—BMI and Electrotek Concepts, Data center operations, 2001, retrieved from http://www.signaturesystem.com/pdfs/24-7.pdf.

Uptime Institute, Inc. and Raritan, Measuring power in your data center, 2009, retrieved from http://www.raritan.com/resources/white-papers/power-management/measuring-power-in-your-datacenter-uptime-institute.pdf.

* cited by examiner

AUTOMATIC DISCOVERY OF SERVER TO POWER-CIRCUIT CONNECTIONS

BACKGROUND

A data center, also known as a "server farm," is a facility used to house server computing devices and a variety of associated supporting electronic devices such as power systems, data communications systems, environmental control systems and security systems. Large data centers can house tens of thousands of server computing devices and associated supporting electronic devices which can collectively consume hundreds of megawatts of power. In addition, a data center is generally expected to operate non-stop (i.e. "24×7") since even the smallest amount of downtime or other disruption in its operation can impair or disrupt the information services which the data center is relied upon to provide. In order to provide this high level of operating reliability each server computing device housed within the data center can have a redundant power system. In other words, each server can have a redundant configuration of two or more power supplies where each power supply is connected to (i.e., "plugged into") a different power-circuit.

SUMMARY

This Summary is provided to introduce a selection of concepts, in a simplified form, that are further described hereafter in the Detailed Description. This Summary is not intended to identify key features or essential features of the claimed subject matter, nor is it intended to be used as an aid in determining the scope of the claimed subject matter.

Server to power-circuit connections (SPC) discovery technique embodiments described herein generally involve the automatic discovery of computer to power-circuit connections. In one exemplary embodiment where a data center includes a plurality of server computers which are connected to a network, a power connection discovery computer which is also connected to the network, a power measurement system (PMS) which is connected to the discovery computer, and a plurality of power-circuits which supply electrical power to the servers, the discovery computer performs the following actions for each server in the data center. It transmits a first command to the server over the network causing the server to start generating an identifiable power consumption signature if the server is able to do so. Upon receiving a SUCCESS response from the server over the network, it instructs the PMS to start measuring the power consumption from each power-circuit. After a prescribed interval of time has elapsed, it collects the measurements from the PMS, and analyzes the measurements to look for the presence of the signature. Upon detecting the signature in the measurement taken from a particular power-circuit, the discovery computer concludes that the server is connected to the particular power-circuit and creates a mapping there-between.

DESCRIPTION OF THE DRAWINGS

The specific features, aspects, and advantages of the server to power-circuit connections (SPC) discovery technique embodiments described herein will become better understood with regard to the following description, appended claims, and accompanying drawings where:

DETAILED DESCRIPTION

In the following description of server to power-circuit connections (SPC) discovery technique embodiments reference is made to the accompanying drawings which form a part hereof, and in which are shown, by way of illustration, specific embodiments in which the SPC discovery technique can be practiced. It is understood that other embodiments can be utilized and structural changes can be made without departing from the scope of the SPC discovery technique embodiments.

The term "server" is used herein to refer to a server computing device that provides information services to users of the data center. The term "power-circuit" is used herein to refer to an electrical circuit that supplies electrical power to one or more electronic devices such as a server and the like.

1.0 Automatic Discovery of Server to Power-Circuit Connections

Generally speaking, the SPC discovery technique embodiments described herein involve the systematic and automatic discovery and mapping of the connections between a plurality of computing devices and the power-circuits which supply electrical power to the computing devices. In other words, the SPC discovery technique embodiments establish an accurate mapping that specifies which computing device is connected to (i.e., plugged into) which power-circuit(s) at any given point in time. While these technique embodiments are described herein in the context of discovering and mapping the power-circuit connections to a plurality of servers in a data center, it is noted that these technique embodiments can also be used to discover and map the power-circuit connections to any other type of computing device, or a mixture of different types of computing devices. It is also noted that the computing devices can be housed in any other type of facility.

Figure 1:
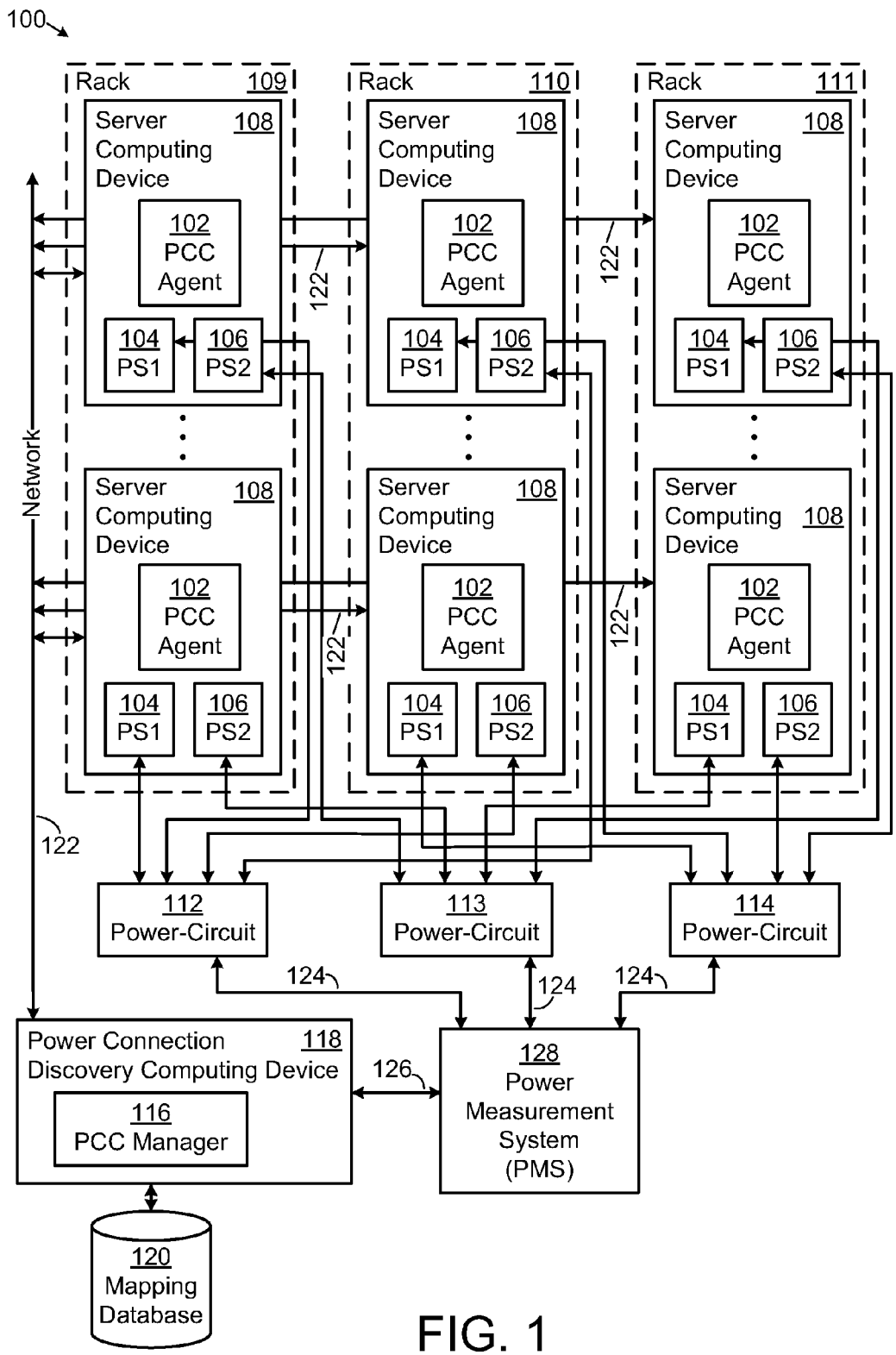
FIG. 1 is a diagram illustrating an exemplary embodiment, in simplified form, of a data center which constitutes an exemplary environment for implementing the SPC discovery technique embodiments.

FIG. 1 illustrates an exemplary embodiment, in simplified form, of a data center which constitutes an exemplary environment for implementing the SPC discovery technique embodiments described herein. As exemplified in FIG. 1, the data center 100 includes a plurality of servers 108 each of which is connected to a data communications network 122. As is described in more detail hereafter, each server includes a variety of different hardware components such as one or more central processing units (CPUs), memory, a graphics processing unit (GPU), one or more disk drives, and the like. Each server 108 and any other device that is connected to the network (such as a power connection discovery computing device 118 which is described hereafter) has a uniquely identifiable network address. In an exemplary embodiment of the SPC discovery technique a conventional Internet protocol (IP) network is employed for the data communications network and the network addresses are IP addresses. However, it is noted that that alternate embodiments of the SPC discovery technique are possible which employ other types of networks for the data communications network.

As described heretofore and referring again to FIG. 1, the servers 108 generally provide information services to users of the data center 100. A server can have a single power supply or a plurality of power supplies. The SPC discovery technique embodiments described herein apply to both of these scenarios.

In order to provide a high level of operating reliability one or more of the servers can have a redundant power system that includes a redundant configuration of two or more power supplies. Servers having such a redundant power system are sometimes referred to as "multi-corded" servers. In the embodiment of the data center which is exemplified in FIG. 1, all of the servers include a first power supply (PS1) 104 and a second power supply (PS2) 106, each of which are connected to (i.e., plugged into) a different power-circuit 112-114, where the second power supply serves as a backup to the first power supply. Industrial design and information technology best practices prescribe that a multi-corded server generally draw the same amount of power from each power-circuit that it is plugged into. It is noted that an alternate embodiment of the data center is also possible where one or more of the servers can have a non-redundant power system that includes a single power supply which is connected to a single power-circuit. As such, it will be appreciated that each power-circuit is connected to one or more servers.

As is common in the art of data center deployment and referring again to FIG. 1, groups of servers 108 can be mounted in individual racks 109-111. In the embodiment of the data center which is exemplified in FIG. 1, the first power supply 104 of all of the servers 108 in a first rack 109 are connected to a first power-circuit 112 and the second power supply 106 of all of the servers in this rack are connected to a second power-circuit 113. The first power supply 104 of all of the servers 108 in a second rack 110 are connected to a third power-circuit 114 and the second power supply 106 of all of the servers in this rack are connected to the first power-circuit 112. The first power supply 104 of all of the servers 108 in a third rack 111 are connected to the second power-circuit 113 and the second power supply 106 of all of the servers in this rack are connected to the third power-circuit 114. This exemplary power connection configuration assumes of course that a single power-circuit has sufficient capacity to supply the level of power needed by the entire group of servers in rack.

In the situation where a single power-circuit does not have sufficient capacity to supply the level of power needed by the entire group of servers in rack, an alternate data center embodiment is possible where the servers in a given rack are divided into sub-groups and each sub-group can be connected to a different power-circuit.

Generally speaking and referring again to FIG. 1, the data center 100 also includes a power measurement system (PMS) 128 which measures the power consumption from each power-circuit 112-114 either continuously or over a prescribed interval of time. More particularly, in one embodiment of the SPC discovery technique described herein a conventional branch circuit monitor (BCM) system is employed for the PMS. The BCM system includes a plurality of non-contact current sensors 124 each of which is arranged to measure the voltage and current flowing through a different power-circuit (i.e., a different "branch circuit"). The BCM system also includes a processor (not shown) which uses the current sensors to measure the voltage and current flowing through each of the power-circuits either continuously or over the prescribed interval of time. This measurement is made by repeatedly sampling the power consumption using a prescribed power measurement sampling interval. This processor then uses the voltage and current measurement samples to calculate the power consumption from each power-circuit over the prescribed interval of time. This processor can also calculate a variety of other parameters for each power-circuit including, but not limited to, root mean square (RMS) voltage, RMS current, power factor, real power and apparent power.

Referring again to FIG. 1, the data center 100 also includes a power connection discovery computing device 118 (hereafter simply referred to as a discovery computing device) which is connected to both the PMS 128 and the data communications network 122. The discovery computing device can optionally manage a mapping database 120 which can store both a current and historic mapping of the connections between each server in the data center and the power-circuit(s) which supply electrical power to the server. In other words, the mapping database includes information that specifies which server is connected to which power-circuit(s) for all of the servers and power-circuits in the data center. Generally speaking, the PMS can be connected to the discovery computing device in a variety of different ways. FIG. 1 exemplifies one way where the PMS is connected to the discovery computing device via a dedicated connection 126. It is noted that an alternate embodiment of the SPC discovery technique described herein is also possible where the PMS is connected to the discovery computing device via the data communications network. The operation of the discovery computing device 118, its interaction with the PMS 128 and all of the servers 108, and the mapping database 120 will be described in more detail hereafter.

The SPC discovery technique embodiments described herein are advantageous for a variety of reasons including, but not limited to, the following. As described heretofore, the SPC discovery technique embodiments systematically and automatically discover and map the connections between a plurality of servers in a data center and the power-circuits which supply electrical power to the servers, where this discovery and mapping is performed in manner which is non-intrusive to the normal operation of the data center. As will be appreciated from the more detailed description which follows, regardless of the number of servers that are housed in the data center, an accurate connection mapping is automatically produced and can optionally be stored in the mapping database for future reference, and this mapping can be automatically updated whenever maintenance activities or configuration changes are performed in the data center that affect this mapping. Examples of such activities/changes include, but are not limited to, adding additional servers to the data center, changing the hardware configuration of existing servers in the data center (such as changing storage or computing capacity, adding or removing power supplies, and the like), removing existing servers from the data center, adding additional power-circuits and accordingly reconfiguring the connections between the servers and power-circuits to utilize the additional power-circuits, and the like.

Additionally, as is appreciated in the art of data center administration, fine grain power monitoring and power configuration management activities are typically performed routinely in a data center in order to optimize the utilization and operating efficiency of the data center resources. As is appreciated in the art of electronic computing devices, the power consumption of a given server can vary significantly over time depending on the hardware configuration of the server, the information services being provided by the server, and the server's workload at any given point in time. Having a mapping database that accurately specifies which server is connected to which power-circuit(s) for all of the servers and power-circuits in the data center at any given point in time is beneficial for a variety of reasons including, but not limited to, the following. The power consumption of the servers in the data center (i.e., the "load" the servers put on the power-circuits) can be provisioned across the power-circuits in a balanced manner to minimize the possibility of exceeding the power capacity of any given power-circuit. This minimizes the risk of overloading a given power-circuit, which can cause a power failure by tripping a circuit breaker in the power-circuit. Furthermore, one or more of the servers can have a redundant power system which includes a redundant configuration of two or more power supplies each of which are connected to a different power-circuit as described heretofore. In this situation, if the circuit breaker in a given power-circuit trips for any reason, the aggregate load of all the servers having redundant power systems will shift (i.e., "fail-over") to the other power-circuit(s) which these servers are connected to. Such fail-over scenarios can be planned for when determining which servers should be connected to which power-circuits so that the occurrence of such a fail-over does not overload the other power-circuits and cause their circuit breakers to also trip.

Additionally, as is also appreciated in the art of electronic computing devices, servers typically don't reach their rated power consumption (i.e., that which is specified for the server). In order to optimize the utilization of the data center resources and reduce costs, some data center administrators have taken the approach of over-subscribing the provisioning of servers to power-circuits. If the situation occurs where the power being consumed from a particular power-circuit gets close to the limit of the particular power-circuit, having a mapping database that accurately specifies which server is connected to which power-circuit(s) for all of the servers and power-circuits in the data center at any given point in time is further beneficial since it allows for the particular servers that are connected to the particular power-circuit to be notified of the desire to throttle down their power consumption.

In addition to the just described advantages, other advantages and benefits of the SPC discovery technique embodiments described herein will become apparent from the more detailed description which follows.

1.1 Underlying Concept

The underlying concept of the SPC discovery technique embodiments described herein is as follows. Generally speaking and as is appreciated in the art of electronic computing devices, there is a direct relationship between the particular computing operations being performed by a given server at a particular point in time and the server's power consumption at this point in time from the power-circuit to which the server is connected. This direct relationship can be thought of as a "communication channel." As will be described in more detail hereafter, the SPC discovery technique embodiments first inject a "signal" into one end of the channel by directing the particular server to perform a prescribed type of processing activity which generates an identifiable power consumption signature. The characteristics of this signature allow it to be reliably and cost-effectively measured by the aforementioned PMS, and detected by the aforementioned discovery computing device, regardless of any other types of processing activities being performed by the particular server, and regardless of how many other servers are connected to the power-circuit to which the server is connected, and regardless of how many other power-circuits are in the data center. The signal is then received at the other end of the channel by using the PMS to measure the power that is consumed from each of the power-circuits in the data center over the prescribed interval of time.

Once the power consumption measurements have been completed on all of the power-circuits, the measurement taken from each power-circuit is collected and then analyzed by the discovery computing device to look for the presence of the identifiable power consumption signature. Exemplary embodiments of a method for this analysis are described in more detail hereafter. When the signature generated by the particular server is detected in the measurement taken from a particular power-circuit, it is concluded that the particular server is connected to the particular power-circuit, and a mapping is created there-between. The signal injection and measurement analysis procedure which has just been generally described is implemented for each server in the data center in order to establish a mapping that specifies the server to power-circuit connections for all of the servers and power-circuits in the data center at any given point in time. It is noted that the signature generated by a multi-corded server will be present in the measurements taken from a plurality of power-circuits.

As is appreciated in the art of electronic computing devices, a server's power consumption can be attributed to a variety of factors in the server including, but not limited to the utilization of various hardware components in the server such as its CPU(s), memory, GPU, disk drive(s), and network interface. A server's power consumption can also be attributed to other factors such as its cooling fan speed, power supply efficiency and the like. As will be described in more detail hereafter, a server's utilization of one or more of its hardware components can be easily controlled by software being executed on the server. When one or more prescribed hardware components are appropriately controlled via software being executed on a given server, the server will generate an identifiable power consumption signature that can be reliably and cost-effectively measured and detected.

1.2 Power Consumption Signature and its Detection

As will be described in more detail hereafter, in the exemplary embodiments of the SPC discovery technique which are described herein a pulse wave power consumption pattern is employed for the identifiable power consumption signature, and a conventional Fourier transform (FT) method is employed to analyze the power consumption measurements and detect the signature. It is noted that alternate embodiments of the SPC discovery technique are also possible which employ other types of power consumption signatures and other types of methods to analyze the power consumption measurements to detect the signatures.

As is appreciated in the art of signal processing, a pulse wave is a bi-level signal waveform which alternates between a "low" signal level and a "high" signal level. Given that $T_L$ denotes a first interval of time during which the waveform has a low signal level and $T_H$ denotes a second interval of time during which the waveform has a high signal level, the period P of the pulse wave is given by the equation $P=T_L+T_H$ and the duty cycle D of the pulse wave is given by the equation $D=T_H/P$. A pulse wave can be either periodic or non-periodic. A square wave is an exemplary type of pulse wave which is periodic and has a 50% duty cycle (i.e. $T_L=T_H$). In an exemplary embodiment of the SPC discovery technique which is described hereafter a square wave is employed for the pulse wave power consumption pattern.

Figure 2A:
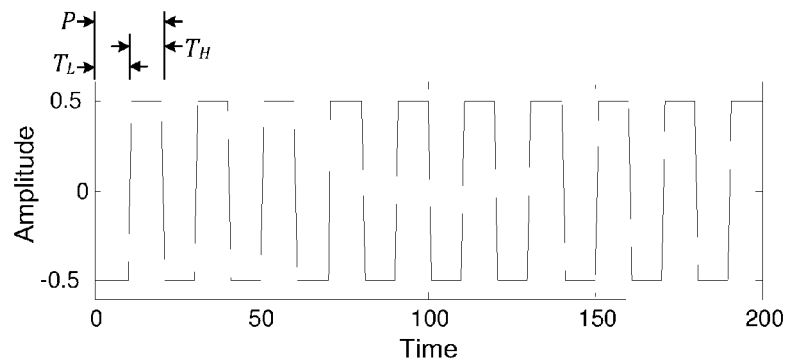
FIGS. 2A and 2B are graphs illustrating an exemplary embodiment of a square wave and a Fourier transform (FT) analysis of the square wave respectively.
Figure 2B:
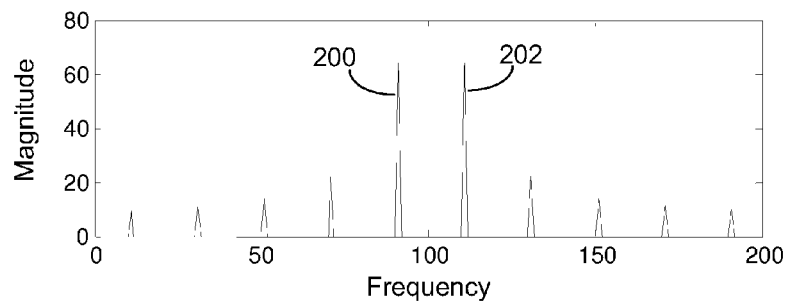
Figure 3A:
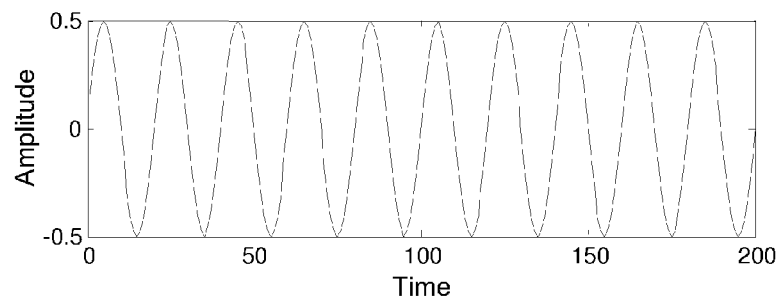
FIGS. 3A and 3B are graphs illustrating an exemplary embodiment of a sine wave having the same amplitude as the square wave and a FT analysis of the sine wave respectively.
Figure 3B:
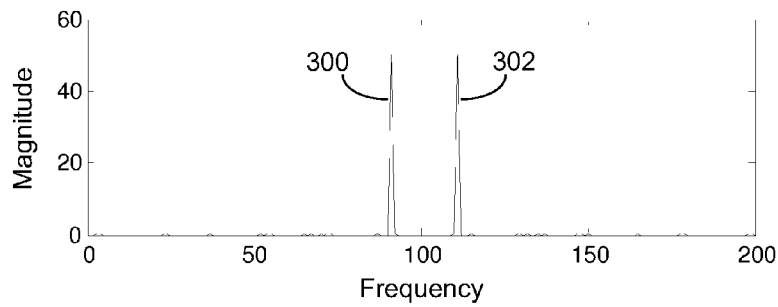

FIG. 2A illustrates an exemplary embodiment of a square wave. As exemplified in FIG. 2A, the square wave has a low signal level for one interval of time $T_L$, a high signal level for another interval of time $T_H=T_L$, and a period $P=T_L+T_H$. FIG. 2B illustrates an exemplary embodiment of a FT (more specifically a discrete Fourier transform (DFT)) analysis of the square wave of FIG. 2A. FIG. 3A illustrates an exemplary embodiment of a sine wave having the same amplitude as the square wave of FIG. 2A. FIG. 3B illustrates an exemplary embodiment of a FT (more specifically a DFT) analysis of the sine wave of FIG. 3A. When comparing FIG. 2B to FIG. 3B it can be seen that although the frequency spectrum of the sine wave is more "pure" than the frequency spectrum of the square wave, the base frequency (i.e., the first harmonic) component of the square wave 200/202 has a higher magnitude than the base frequency component of the sine wave 300/302.

As described heretofore, the aforementioned PMS measures the power consumption from each power-circuit, where each power-circuit is connected to one or more servers. Since a given power-circuit will typically be connected to a plurality of servers, the identifiable power consumption signature that is generated by a particular server that is connected to the power-circuit will typically be amalgamated with the power consumption of the other servers that are connected to the power-circuit. In other words, the power consumption measurement taken from a given power-circuit will typically be an aggregate measurement of the power consumption of all the servers that are connected to the power-circuit. However, it is noted that when a server is not performing the aforementioned prescribed type of processing activity which generates the identifiable signature, but rather the server is performing normal information services processing operations, the power consumption of the server will not exhibit a periodicity. Therefore, given a plurality of servers that are all connected to a particular power-circuit, if only one of the servers is generating the square wave power consumption pattern, the base frequency component of this pattern will be distinctive and therefore will be easily detectable when the power consumption measurement taken from the particular power-circuit is analyzed since the power consumption of the other servers will appear as "noise" in the analysis. An example of this will now be provided.

Figure 4A:
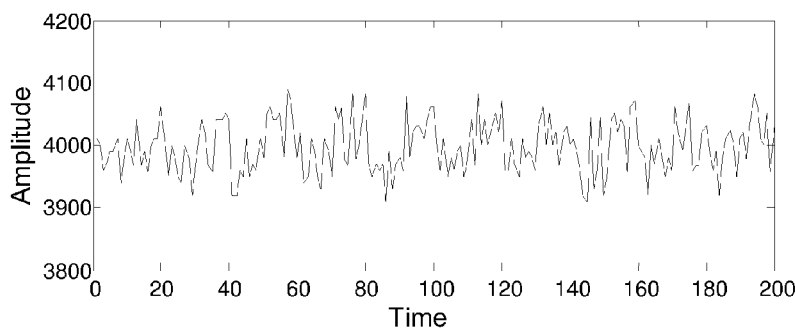
FIG. 4A is a graph illustrating an exemplary embodiment of a power consumption measurement taken from a power-circuit which is connected to 25 servers, where one of the servers is performing a prescribed type of processing activity which generates a square wave power consumption pattern having an average power of 50 W, and the other 24 servers are performing normal information services processing operations.
Figure 4B:
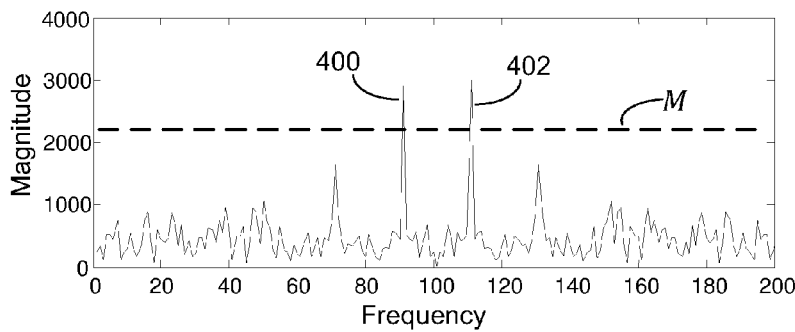
FIG. 4B is a graph illustrating an exemplary embodiment of a FT analysis of the power consumption measurement of FIG. 4A.

FIG. 4A illustrates an exemplary embodiment of a power consumption measurement taken from a power-circuit which is connected to 25 servers, where only one of the servers is performing the prescribed type of processing activity which generates a square wave power consumption pattern having an average power of 50 W, and the other 24 servers are performing normal information services processing operations. FIG. 4B illustrates an exemplary embodiment of a FT analysis of the power consumption measurement of FIG. 4A. As exemplified in FIG. 4A, the square wave power consumption pattern has little effect in the time domain of the measurement. As exemplified in FIG. 4B however, this pattern (as well as the other types of periodic pulse wave power consumption patterns described herein) produces a pair of frequency component spikes 400 and 402 in the frequency domain of the measurement, where these particular spikes are distinctive in the frequency domain since they have a magnitude which is significantly larger than any of the other frequency components of the measurement. Thus, this pair of spikes 400 and 402 can be easily and reliably detected by performing a conventional thresholding operation on the frequency components of the measurement, where the thresholding operation looks for frequency components having a magnitude that is larger than a prescribed threshold M. The value of M is set sufficiently above the magnitude of the other frequency components of the measurement such that the pair of spikes 400 and 402 can be reliably detected. Given that the square wave power consumption pattern has a period equal to P, the pair of distinctive frequency component spikes 400 and 402 produced by this pattern will generally be centered at a known frequency equal to $\pi/P$. Thus, different square wave power consumption patterns having different periods will produce different pairs of distinctive frequency component spikes which are centered at different known frequencies.

Figure 5A:
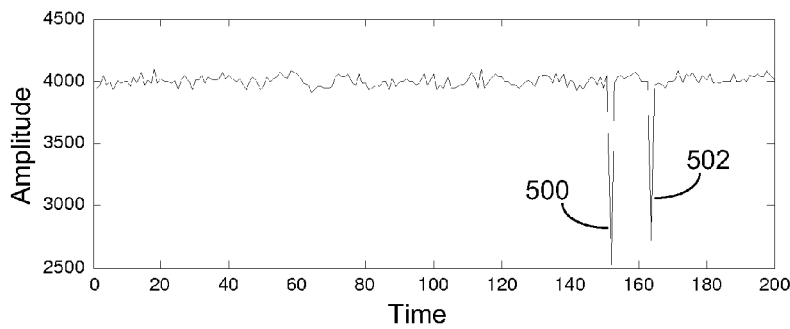
FIG. 5A is a graph illustrating an exemplary embodiment of a power consumption measurement taken from a power-circuit which is connected to 25 servers, where one of the servers is performing a prescribed type of processing activity which generates a square wave power consumption pattern having an average power of 50 W, another one of the servers is being shutdown, and the other 23 servers are performing normal information services processing operations.
Figure 5B:
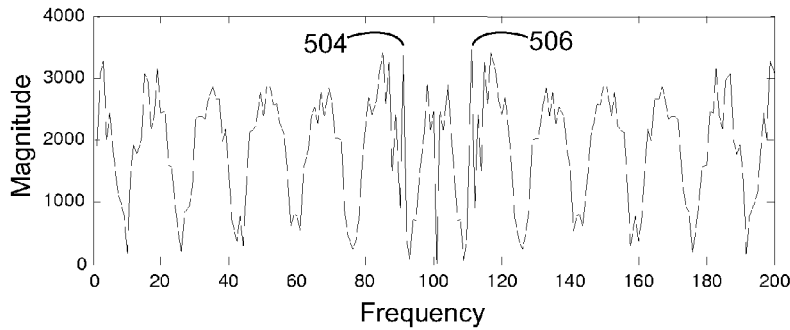
FIG. 5B is a graph illustrating an exemplary embodiment of a FT analysis of the power consumption measurement of FIG. 5A.

It is noted that under certain circumstances, such as when the power consumption of the aforementioned servers which are performing normal information services processing operations is not "stationary," the two particular frequency component spikes produced by the square wave power consumption pattern may not be distinctive enough in the frequency domain to be detected reliably. By way of example, but not limitation, FIG. 5A illustrates an exemplary embodiment of a power consumption measurement taken from a power-circuit which is connected to 25 servers, where only one of the servers is generating the square wave power consumption pattern having an average power of 50 W, another one of the servers is being shutdown, and the other 23 servers are performing normal information services processing operations. As exemplified in FIG. 5A, the server shutdown appears as two downward spikes 500 and 502 in the time domain. FIG. 5B illustrates an exemplary embodiment of a FT analysis of the power consumption measurement of FIG. 5A. As exemplified in FIG. 5B, while the two particular frequency component spikes 504 and 506 produced by the square wave power consumption pattern are present in the FT analysis of the power consumption measurement of FIG. 5A, they do not have a magnitude that is sufficiently above the magnitude of the other frequency components of the measurement and thus they cannot be reliably detected. This type of circumstance can be detected by monitoring the raw power consumption measurements before the FT analysis is applied. In this type of circumstance, the aforementioned procedure of having the server generate the identifiable power consumption signature (i.e., the square wave power consumption pattern), and then having the PMS measure the power that is consumed from each of the power-circuits in the data center over the prescribed interval of time, and then having the discovery computing device collect the measurement taken from each power-circuit and analyze each measurement to look for the presence of the square wave pattern can be repeated.

1.3 Software Implementation

This section describes an exemplary embodiment of a software framework for implementing the SPC discovery technique described herein.

Referring again to FIG. 1, a power consumption control (PCC) agent module 102 (also known as a daemon or a service in the art of software) is installed on each of the servers 108 in the data center 100 that provide information services to users of the data center. A PCC manager module 116 is installed on the discovery computing device 118. Generally speaking, the various PCC agent modules and the PCC manager module inter-operate over the network as follows. When the PCC agent module on a given server is first executed, the PCC agent module opens a particular port on the server, where the port is used to receive commands over the network from the PCC manager module. The PCC agent module is accessible over the network 122 from the port on the server and the network address (such as the IP address) of the server on which the agent is being executed. The PCC agent module runs in the background on each server 108 and "listens" on the network for commands from the PCC manager module (i.e., the PCC agent module listens to the port). As will be described in more detail hereafter, when the PCC agent module receives a command over the network on the port, the PCC agent module will act accordingly. The PCC manager module knows the network address of each of the servers in the data center and the particular port on each server that the PCC agent module is listening to.

As is appreciated in the art of computer networking and referring again to FIG. 1, the PCC manager module 116 on the power connection discovery computing device 118 transmits a command to the PCC agent module 102 on a particular server 108 by first connecting over the network 122 to the particular port on the server that the PCC agent module is listening to, and then transmitting the command to the particular port. The PCC manager module can transmit a variety of commands over the network to any of the PCC agent modules. Two exemplary commands are a RUN command and a QUIT command. These commands will now be described in more detail.

1.4 Process Implementation

Figure 6A:
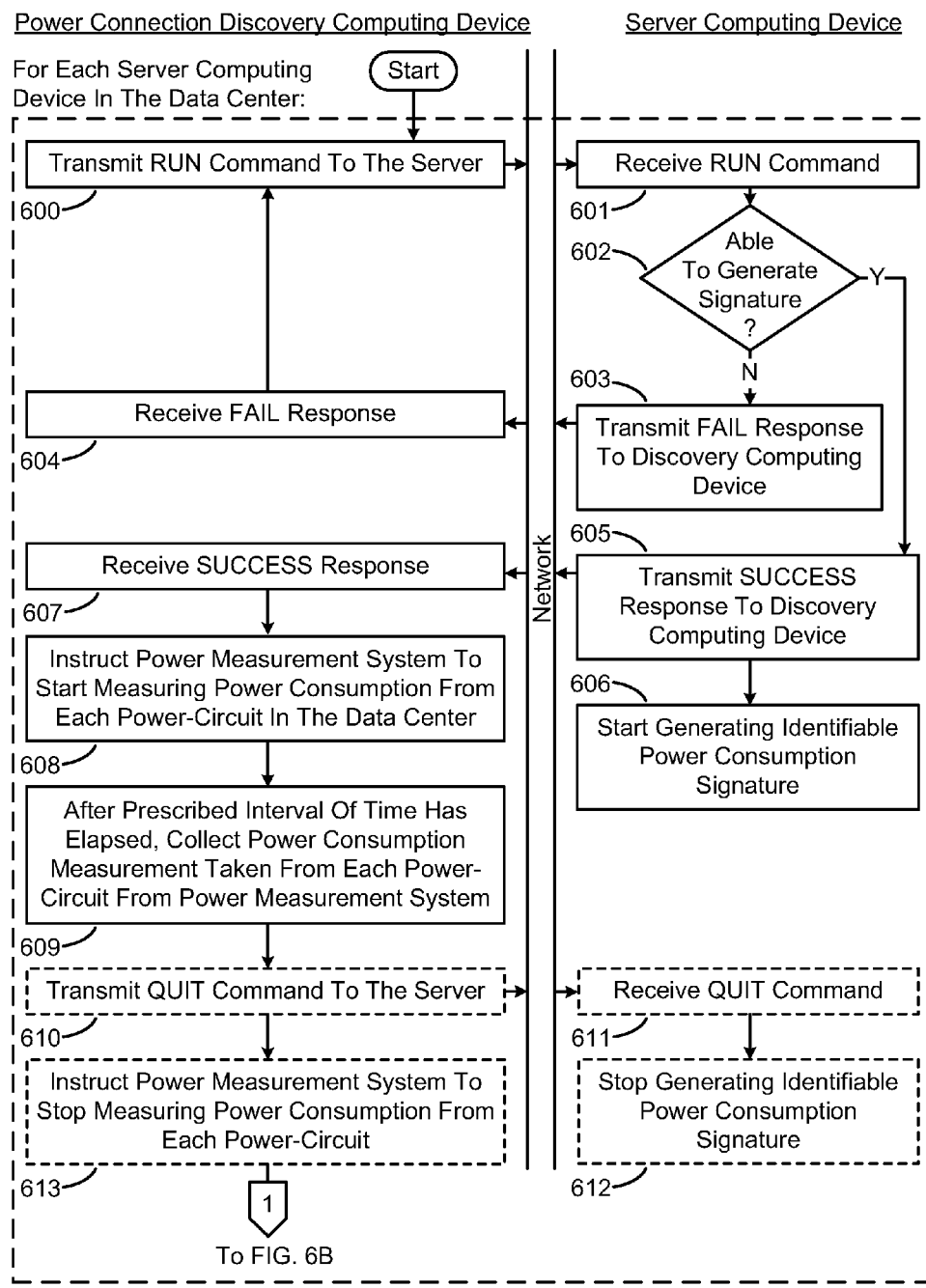
FIGS. 6A and 6B are a flow diagram illustrating an exemplary embodiment, in simplified form, of a process for automatically discovering server to power-circuit connections.
Figure 6B:
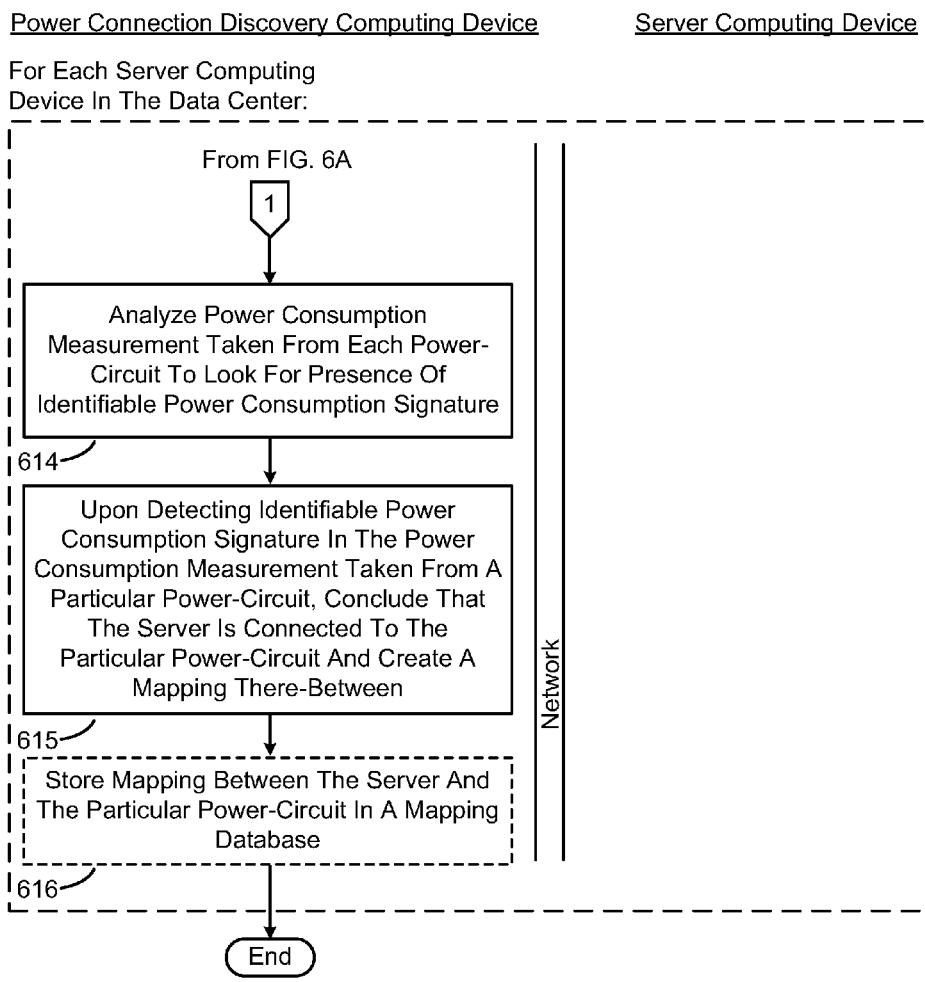

FIGS. 6A and 6B illustrate an exemplary embodiment, in simplified form, of a process for automatically discovering server to power-circuit connections. Generally speaking, this process is performed for each server in the data center. In the particular situation where the PCC agent module on each server generates a similar power consumption signature (such as the situation where the servers each generate a square wave power consumption pattern having a common period P, and the like), the process exemplified in FIGS. 6A and 6B will be performed for each server in a serial manner (i.e., one server at a time).

As exemplified in FIG. 6A, the process starts in block 600 by the PCC manager module on the discovery computing device transmitting the RUN command to the server over the network. The RUN command can optionally include one or more parameters each of which specifies a different characteristic for a desired identifiable power consumption signature. Exemplary characteristics which can be specified by these optional parameters include, but are not limited to, a desired waveform shape for the signature, a desired period of the signature, a desired amplitude of the signature, and a prescribed interval of time during which the signature is to be generated. In the situation where the RUN command does not include any of these parameters, a default signature will be generated by the server.

Referring again to FIG. 6A, upon the PCC agent module on the server receiving the RUN command over the network (block 601), the PCC agent module will determine if it is able to generate the identifiable power consumption signature (block 602). If the PCC agent module determines that the signature can't be generated (block 602), the PCC agent module will transmit a FAIL response over the network to the discovery computing device (block 603). This FAIL response will include information specifying the reason that the signature could not be generated. Exemplary reasons include, but are not limited to, the server having insufficient hardware resources to generate the amplitude of the signature specified by a parameter in the RUN command that was received, or the server is currently running other applications that prevent it from generating the signature. Upon the PCC manager module on the discovery computing device receiving the FAIL response over the network (block 604), the PCC manager module can either retransmit the same RUN command to the server at a later point in time, or can alter one or more parameters in the RUN command and transmit a new RUN command to the server (block 600).

Referring again to FIG. 6A, if the PCC agent module on the server determines that the identifiable power consumption signature can be generated (block 602), the PCC agent module will transmit a SUCCESS response over the network to the discovery computing device (block 605), and will start generating the signature (block 606). Before starting to generate the signature, in the situation where the server's CPU(s) is the prescribed hardware component whose utilization is to be controlled in order to generate the signature, the PCC agent module can optionally query the server's operating system in order to identify the particular type and number of CPUs employed in the server. The PCC agent module can then use this information to determine how many CPU cores are employed in the server and the level of utilization to employ for each CPU core in order for the server to generate a detectable signature.

As described heretofore, in an exemplary embodiment of the SPC discovery technique described herein a square wave power consumption pattern is employed for the identifiable power consumption signature. The PCC agent module generates the square wave power consumption pattern by repeatedly toggling the utilization of one or more prescribed hardware components in the server from an idle state (i.e., zero utilization) to 100% utilization, where $T_0$ is a first interval of time during which the hardware components are idle, $T_{100}$ is a second interval of time during which the hardware components are 100% utilized, and $T_0=T_{100}$. This results in the square wave pattern having a period $P=T_0+T_{100}$ and a 50% duty cycle. In one embodiment of the SPC discovery technique the one or more prescribed hardware components are the server's CPU(s). Alternate embodiments of the SPC discovery technique are also possible where the one or more prescribed hardware components are the server's memory, GPU, one or more disk drives, or any combination thereof.

Generally speaking, $T_0$ and $T_{100}$ can have a variety of values. It is noted however that the following tradeoffs exist when deciding on the particular value to use for $T_0$ and $T_{100}$. Increasing the value of $T_0$ and $T_{100}$ will generally increase the average power of the square wave power consumption pattern that is generated by the server, which will tend to enhance its detectability. However, increasing the average power of the pattern will increase the amount of incremental power that the server consumes from the power-circuit(s) to which it is connected when it is generating the pattern, which detracts from the power that is available to the other servers that are connected to the same power-circuit(s). Furthermore, it will be appreciated that increasing the value of $T_0$ and $T_{100}$ will also increase the interval of time it takes for the PMS to measure the power consumption from each power-circuit.

In an exemplary embodiment of the SPC discovery technique described herein $T_0$ and $T_{100}$ are set equal to 30 seconds, resulting in the server generating a square wave power consumption pattern having a period P equal to one minute, the power measurement sampling interval is set equal to 15 seconds, and the interval of time during which the PMS measures the power consumption from each power-circuit is set equal to 10 P (i.e., 10 minutes). When this power consumption pattern is generated on a conventional HP ProLiant DL385 server this pattern has an average power of 50 W and the server's power consumption from the power-circuit to which it is connected increased from 250 W to 275 W. This incremental 25 W power consumption is quite small considering the fact that a typical power-circuit in a data center can supply Kilowatts of power. It is noted that alternate embodiments of the SPC discovery technique are also possible where other values are employed for $T_0$, $T_{100}$, the power measurement sampling interval, and the interval of time during which the PMS measures the power consumption from each power-circuit.

Referring again to FIG. 6A, upon the PCC manager module on the discovery computing device receiving the SUCCESS response over the network (block 607), the PCC manager module will instruct the PMS to start measuring the power consumption from each power-circuit in the data center (block 608). After the prescribed interval of time has elapsed, the PCC manger module collects the power consumption measurement taken from each power-circuit from the PMS (block 609). The PCC manger module can optionally then transmit the QUIT command to the server over the network (block 610). The PCC manager module can also optionally instruct the PMS to stop measuring the power consumption from each power-circuit (block 613). Upon the PCC agent module on the server receiving the optional QUIT command (block 611), the PCC agent module will stop generating the identifiable power consumption signature (block 612). In one embodiment of the SPC discovery technique the PCC agent module can then stop executing, which releases the port and other server resources that are being used by the agent. In another embodiment of the SPC discovery technique the PCC agent module can continue to run in the background and wait to receive another command over the network on the port. In yet another embodiment of the SPC discovery technique where the RUN command includes the aforementioned parameter that specifies the prescribed interval of time during which the signature is to be generated, it will be appreciated that it is unnecessary for the discovery computing device to transmit the QUIT command to the server since the server will automatically stop generating the signature after the prescribed interval of time has elapsed.

Referring again to FIG. 6A and as exemplified in FIG. 6B, after the PCC manager module on the discovery computing device collects the power consumption measurement taken from each power-circuit from the PMS (block 609), the PCC manager module analyzes the power consumption measurement taken from each power-circuit to look for the presence of the identifiable power consumption signature (block 614). In the exemplary embodiment of the SPC discovery technique described heretofore where the server is generating the square wave power consumption pattern, this analysis is performed by analyzing the measurement in the frequency domain using a Fourier transform method and looking for a pair of frequency component spikes in the frequency domain that have a magnitude that is larger than the aforementioned prescribed threshold M.

Referring again to FIG. 6B, upon the PCC manager module on the discovery computing device detecting the identifiable power consumption signature in the power consumption measurement taken from a particular power-circuit, the PCC manager module concludes that the server is connected to the particular power-circuit and creates a mapping there-between (block 615). The PCC manager module can then optionally store the mapping between the server and the particular power-circuit in the aforementioned mapping database (block 616).

In one embodiment of the SPC discovery technique described herein the process exemplified in FIGS. 6A and 6B can be performed once either after the servers are physically installed in the data center, or after the data center configuration is modified by either adding a new server to the data center, or removing an existing server from the data center, or changing the power-circuit connections for one or more of the existing servers, so that the mapping database includes a current mapping of the server to power-circuit connections. In another embodiment of the SPC discovery technique this process can be performed repeatedly at a prescribed time interval in order to automatically detect any changes in the server to power-circuit connections and update the mapping database accordingly, so that the database includes both a current and historic mapping of the server to power-circuit connections.

When the process exemplified in FIGS. 6A and 6B is being performed it is desirable that the power consumption of all the servers in the data center which are not currently generating the identifiable power consumption signature is stationary (i.e., it is desirable that no abrupt changes occur in the power consumption of these servers). In the event that this process does not detect the identifiable signature in the power consumption measurement taken from any of the power-circuits, this process can be repeated.

It will thus be appreciated that the SPC discovery technique embodiments described herein are further advantageous for the following reasons. The identifiable power consumption signature is generated on each server in an easy and cost effective manner that does not impair or disrupt the information services which the server is relied upon to provide. The server consumes a relatively small amount of incremental power from the power-circuit(s) to which the it is connected when it is generating the signature. The method used to analyze the power consumption measurements and detect the signature is both cost effective and reliable.

2.0 Additional Embodiments

While the SPC discovery technique has been described in more detail by specific reference to embodiments thereof, it is understood that variations and modifications thereof can be made without departing from the true spirit and scope of the SPC discovery technique. By way of example but not limitation, rather than employing a square wave for the aforementioned pulse wave power consumption pattern that is generated by the PCC agent module on each server, other types of waveform patterns can also be employed. More particularly, in one alternate embodiment a periodic pulse wave power consumption pattern having a duty cycle which is less than 50% can be generated by the PCC agent module on each server by repeatedly toggling the utilization of the one or more prescribed hardware components in the server from an idle state (i.e., zero utilization) to 100% utilization, where $T_0$ is the interval of time during which the hardware component is idle, $T_{100}$ is the interval of time during which the hardware component is 100% utilized, and $T_0 > T_{100}$. In another alternate embodiment a periodic pulse wave power consumption pattern having a duty cycle which is greater than 50% can be generated by the PCC agent module on each server by repeatedly toggling the utilization of the one or more prescribed hardware components in the server from an idle state (i.e., zero utilization) to 100% utilization, where $T_0<T_{100}$. In yet another alternate embodiment a pulse wave power consumption pattern that includes an identifiable code (such as the server's IP address and the like) can be generated by the PCC agent module on each server by toggling the utilization of the one or more prescribed hardware components in the server from an idle state to 100% utilization using a conventional code division multiple access (CDMA) scheme to modulate the pulse wave power consumption pattern such that the pattern includes the identifiable code. The identifiable code can be used to verify the server that generated the power consumption pattern.

Additionally, rather than the PCC agent module on each server in the data center generating a similar power consumption signature as described heretofore, the PCC agent module on two or more of the servers can optionally generate different power consumption signatures as follows. In one alternate embodiment of the SPC discovery technique two or more of the servers can each generate a square wave power consumption pattern having a different period P in a concurrent manner. Since the pair of distinctive frequency component spikes produced by a given square wave power consumption pattern are centered at a known frequency equal to $\pi/P$ as described heretofore, the concurrently generated square wave patterns can be differentiated and individually detected during the analysis of the power consumption measurement taken from each power-circuit, even when the servers which concurrently generated the patterns are connected to the same power-circuit. In another alternate embodiment two or more of the servers can each generate a modulated pulse wave power consumption pattern having a different identifiable code in a concurrent manner. Since the codes are different, the concurrently generated modulated pulse wave patterns can be differentiated and individually detected during the analysis of the power consumption measurement taken from each power-circuit, even when the servers which concurrently generated the patterns are connected to the same power-circuit.

It is also noted that any or all of the aforementioned embodiments can be used in any combination desired to form additional hybrid embodiments. Although the SPC discovery technique embodiments have been described in language specific to structural features and/or methodological acts, it is to be understood that the subject matter defined in the appended claims is not necessarily limited to the specific features or acts described heretofore. Rather, the specific features and acts described heretofore are disclosed as example forms of implementing the claims.

3.0 Computing Environment

This section provides a brief, general description of a suitable computing system environment in which portions of the SPC discovery technique embodiments described herein can be implemented. These SPC discovery technique embodiments are operational with numerous general purpose or special purpose computing system environments or configurations. Exemplary well known computing systems, environments, and/or configurations that can be suitable include, but are not limited to, personal computers (PCs), server computers, hand-held or laptop devices, multiprocessor systems, microprocessor-based systems, set top boxes, programmable consumer electronics, network PCs, minicomputers, mainframe computers, distributed computing environments that include any of the aforementioned systems or devices, and the like.

Figure 7:
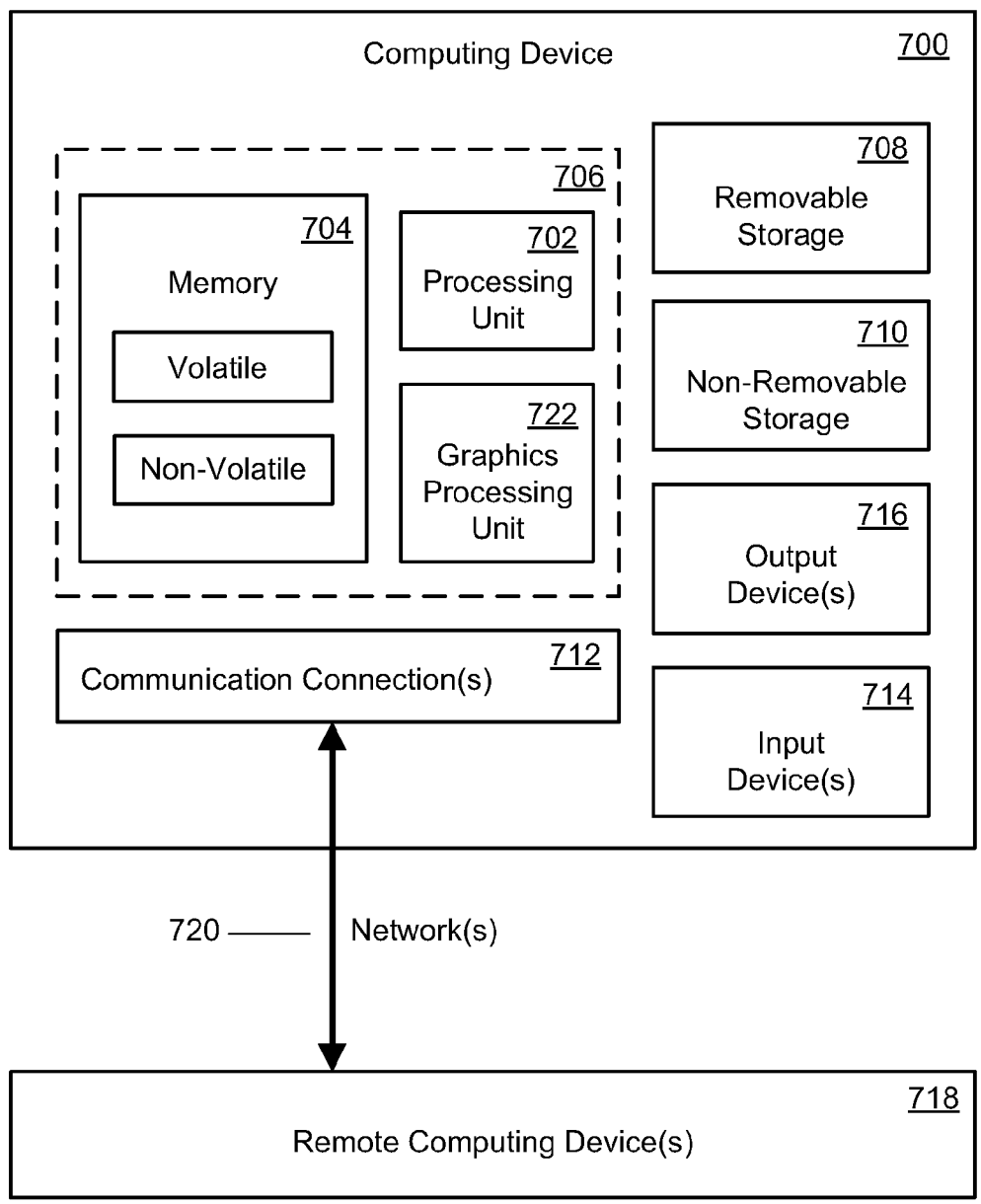
FIG. 7 is a diagram illustrating an exemplary embodiment, in simplified form, of a network-based computing device which constitutes an exemplary system for implementing portions of the SPC discovery technique embodiments.

FIG. 7 illustrates an exemplary embodiment, in simplified form, of a suitable computing system environment according to the SPC discovery technique embodiments described herein. The environment illustrated in FIG. 7 is only one example of a suitable computing system environment and is not intended to suggest any limitation as to the scope of use or functionality of the SPC discovery technique embodiments described herein. Neither should the computing system environment be interpreted as having any dependency or requirement relating to any one or combination of components exemplified in FIG. 7.

As exemplified in FIG. 7, an exemplary system for implementing portions of the SPC discovery technique embodiments described herein includes one or more computing devices, such as computing device 700. In its simplest configuration, computing device 700 typically includes at least one central processing unit (CPU) 702 and memory 704. Depending on the specific configuration and type of computing device, the memory 704 can be volatile (such as RAM), non-volatile (such as ROM and flash memory, among others) or some combination of the two. This simplest configuration is illustrated by dashed line 706.

As exemplified in FIG. 7, computing device 700 can also have additional features and functionality. By way of example, computing device 700 can include at least one graphics processing unit 722 and additional storage such as removable storage 708 and/or non-removable storage 710. This additional storage includes, but is not limited to, magnetic disks, optical disks and tape. Computer storage media typically embodies volatile and non-volatile media, as well as removable and non-removable media implemented in any method or technology. The computer storage media provides for storage of various information needed to operate the device 700 such as computer readable instructions associated with an operating system, application programs and other program modules, and data structures, among other things. Memory 704, removable storage 708 and non-removable storage 710 are all examples of computer storage media. Computer storage media includes, but is not limited to, RAM, ROM, EEPROM, flash memory or other memory technology, CD-ROM, digital versatile disks (DVD) or other optical disk storage technology, magnetic cassettes, magnetic tape, magnetic disk storage or other magnetic storage devices, or any other medium which can be used to store the desired information and which can be accessed by computing device 700. Any such computer storage media can be part of computing device 700.

As exemplified in FIG. 7, computing device 700 also includes a communications connection(s) 712 that allows the device to operate in a networked environment and communicate with a remote computing device(s), such as remote computing device(s) 718. Remote computing device(s) 718 can be a PC, a server, a router, a peer device, or other common network node, and typically includes many or all of the elements described herein relative to computing device 700. Communication between computing devices takes place over a network(s) 720, which provides a logical connection(s) between the computing devices. The logical connection(s) can include one or more different types of networks including, but not limited to, a local area network(s) (LAN) and wide area network(s) (WAN). Such networking environments are commonplace in conventional offices, enterprise-wide computer networks, intranets and the Internet. It will be appreciated that the communications connection(s) 712 and related network(s) 720 described herein are exemplary and other means of establishing communication between the computing devices can be used.

As exemplified in FIG. 7, communications connection(s) 712 and related network(s) 720 are an example of communication media. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, but not limitation, communication media includes wired media such as a wired network or direct-wired connection, and wireless media such as acoustic, radio frequency (RF), infrared, frequency modulation (FM) radio and other wireless media. The term "computer-readable medium" as used herein includes both the aforementioned storage media and communication media.

As exemplified in FIG. 7, computing device 700 also includes an input device(s) 714 and output device(s) 716. Exemplary input devices 714 include, but are not limited to, a keyboard, mouse, pen, touch input device, microphone, and camera, among others. A user can enter commands and various types of information into the computing device 700 through the input device(s) 714. Exemplary output devices 716 include, but are not limited to, a display device(s), printer, and audio output devices, among others. These input and output devices are well known and need not be described at length here.

Referring again to FIG. 7, the SPC discovery technique embodiments described herein can be further described and/or implemented in the general context of computer-executable instructions, such as program modules, which are executed by computing device 700. Generally, program modules include routines, programs, objects, components, and data structures, among other things, that perform particular tasks or implement particular abstract data types. The SPC discovery technique embodiments can also be practiced in a distributed computing environment where tasks are performed by one or more remote computing devices 718 that are linked through a communications network 712/720. In a distributed computing environment, program modules can be located in both local and remote computer storage media including, but not limited to, memory 704 and storage devices 708/710.

Wherefore, what is claimed is:

1. A system for automatically discovering computer to power-circuit connections, comprising:
   a plurality of computers, wherein each computer is connected to a network; and
   a computer program having program modules executable by each computer, wherein each of the computers is directed by the program modules of the computer program to generate a power consumption signature, and wherein either,
   the power consumption signature generated by each computer is similar and the computers each generate said signature in a serial manner, or
   two or more of the computers each generate a square wave power consumption pattern power consumption signature having a different period in a concurrent manner, or
   two or more of the computers each generate a modulated pulse wave power consumption pattern power consumption signature comprising a different identifiable code in a concurrent manner.

2. The system of claim 1, wherein the program module for generating a power consumption signature comprises program modules for:
   listening on the network for commands; and
   upon a particular computer receiving a first appropriate command over the network, whenever said computer is able to generate said signature, repeatedly toggling the utilization of one or more prescribed hardware components in said computer from an idle state to 100% utilization, wherein,
   $T_0$ is a first interval of time during which said hardware components are idle,
   $T_{100}$ is a second interval of time during which said hardware components are 100% utilized, and
   the pulse wave power consumption pattern is periodic, and comprises a period P given by the equation $P=T_0+T_{100}$ and a duty cycle D given by the equation $D=T_{100}/P$.

3. The system of claim 2, wherein the one or more prescribed hardware components comprise either a central processing unit, or memory, or a graphics processing unit, or one or more disk drives.

4. The system of claim 2, wherein $T_0=T_{100}$ such that the pulse wave power consumption pattern comprises a square wave power consumption pattern and the duty cycle D equals 50%.

5. The system of claim 4, wherein $T_0$ and $T_{100}$ are set equal to 30 seconds.

6. The system of claim 2, wherein $T_0$ is greater than $T_{100}$ such that the duty cycle D is less than 50%.

7. The system of claim 2, wherein $T_0$ is less than $T_{100}$ such that the duty cycle D is greater than 50%.

8. The system of claim 2, wherein the program module for generating a power consumption signature further comprises a program module for stopping the repeated toggling of the utilization of the one or more prescribed hardware components in the particular computer upon said computer receiving a second appropriate command over the network.

9. The system of claim 1, wherein the program module for generating a power consumption signature comprises program modules for:
   listening on the network for commands; and
   upon a particular computer receiving a first appropriate command over the network, whenever said computer is able to generate said signature, toggling the utilization of one or more prescribed hardware components in said computer from an idle state to 100% utilization using a code division multiple access scheme to modulate the pulse wave power consumption pattern such that said pattern comprises an identifiable code.

10. In a data center comprising a plurality of server computers each of which is connected to a network, a power connection discovery computer which is also connected to the network, a power measurement system (PMS) which is connected to the discovery computer, and a plurality of power-circuits each of which is connected to one or more server computers and supplies electrical power to said servers, a computer-implemented process for automatically discovering the server to power-circuit connections, comprising using the discovery computer to perform the following process actions:
   for each server computer in the data center:
   (a) transmitting a first command to the server over the network causing the server to start generating an identifiable power consumption signature if the server is able to do so;
   (b) upon receiving a SUCCESS response from the server over the network, instructing the PMS to start measuring the power consumption from each power-circuit;

(c) after a prescribed interval of time has elapsed, collecting the power consumption measurement taken from each power-circuit from the PMS;

(d) analyzing the power consumption measurement taken from each power-circuit to look for the presence of said signature; and (e) upon detecting said signature in the power consumption measurement taken from a particular power-circuit, concluding that the server is connected to the particular power-circuit and creating a mapping there-between.

11. The process of claim 10, wherein the PMS comprises a branch circuit monitor system.

12. The process of claim 10, wherein the identifiable power consumption signature comprises a square wave power consumption pattern having a period equal to P and the prescribed interval of time equals 10P.

13. The process of claim 12, wherein the process action of analyzing the power consumption measurement taken from each power-circuit to look for the presence of the power consumption signature comprises the action of analyzing said measurement in the frequency domain using a Fourier transform method and looking for a pair of frequency component spikes in said domain that comprise a magnitude that is larger than a prescribed threshold, wherein said threshold is set sufficiently above the magnitude of the other frequency components of said measurement such that said spikes can be reliably detected.

14. The process of claim 13, further comprising performing process actions a-e again whenever the pair of frequency component spikes does not have a magnitude that is sufficiently above the magnitude of the other frequency components of the power consumption measurement taken from each power-circuit and thus said spikes cannot be reliably detected.

15. The process of claim 10, further comprising performing after the process action e is complete the action of storing the mapping between the server and the particular power-circuit in a mapping database, wherein the database specifies which server is connected to which power-circuit or power-circuits for all of the servers and power-circuits in the data center.

16. The process of claim 15, wherein either,
process actions a-e and the subsequent process action of storing the mapping between the server and the particular power-circuit in a mapping database are performed once either after the server computers are installed in the data center, or after the data center configuration is modified by either adding a new server to the data center, or removing an existing server from the data center, or changing the power-circuit connections for one or more of the existing servers so that the mapping database includes a current mapping of the server to power-circuit connections, or
process actions a-e and the subsequent process action of storing the mapping between the server and the particular power-circuit in a mapping database are performed repeatedly at a prescribed time interval in order to automatically detect any changes in the server to power-circuit connections and update the mapping database accordingly so that the database includes both a current and historic mapping of the server to power-circuit connections.

17. The process of claim 10, wherein the first command comprises one or more parameters each of which specifies a different characteristic for a desired identifiable power consumption signature, said characteristics comprising:
a desired waveform shape for said signature;
a desired period of said signature;
a desired amplitude of said signature; and
the prescribed interval of time.

18. In a data center comprising a plurality of server computers each of which is connected to a network, a power connection discovery computer which is also connected to the network, a power measurement system (PMS) which is connected to the discovery computer, and a plurality of power-circuits each of which is connected to one or more server computers and supplies electrical power to said servers, a computer-implemented process for automatically discovering the server to power-circuit connections, comprising using the discovery computer to perform the following process actions:

for each server computer in the data center:
transmitting a first command to the server over the network causing the server to start generating a square wave power consumption pattern if the server is able to do so, wherein,
said pattern is generated by repeatedly toggling the utilization of one or more central processing units (CPUs) in said server from an idle state to 100% utilization,
$T_0$ is a first interval of time during which the CPUs are idle,
$T_{100}$ is a second interval of time during which the CPUs are 100% utilized,
$T_0=T_{100}$, and
said pattern comprises a period P given by the equation $P=T_0+T_{100}$;

upon receiving a SUCCESS response from the server over the network, instructing the PMS to start measuring the power consumption from each power-circuit;

after an interval of time equal to 10P has elapsed, collecting the power consumption measurement taken from each power-circuit from the PMS;

analyzing the power consumption measurement taken from each power-circuit to look for the presence of said pattern, said analysis comprising analyzing said measurement in the frequency domain using a Fourier transform method and looking for a pair of frequency component spikes in said domain that comprise a magnitude that is larger than a prescribed threshold, wherein said threshold is set sufficiently above the magnitude of the other frequency components of said measurement such that said spikes can be reliably detected;

upon detecting said pattern in the power consumption measurement taken from a particular power-circuit, concluding that the server is connected to the particular power-circuit and creating a mapping there-between; and storing the mapping between the server and the particular power-circuit in a mapping database, wherein the database specifies which server is connected to which power-circuit or power-circuits for all of the servers and power-circuits in the data center.

* * * * *

UNITED STATES PATENT AND TRADEMARK OFFICE
CERTIFICATE OF CORRECTION

| | | |
|---|---|---|
| PATENT NO. | : 8,370,652 B2 | Page 1 of 1 |
| APPLICATION NO. | : 12/688207 | |
| DATED | : February 5, 2013 | |
| INVENTOR(S) | : Liu et al. | |

It is certified that error appears in the above-identified patent and that said Letters Patent is hereby corrected as shown below:

In the Specification

Column 3, line 22, delete "that that" and insert -- that --, therefor.

Signed and Sealed this
Third Day of February, 2015

Michelle K. Lee
*Deputy Director of the United States Patent and Trademark Office*